(12) United States Patent
Kim et al.

(10) Patent No.: US 6,685,800 B2
(45) Date of Patent: Feb. 3, 2004

(54) APPARATUS FOR GENERATING INDUCTIVELY COUPLED PLASMA

(75) Inventors: Hong Seub Kim, Yongin-shi (KR); Gi Chung Kwon, Kyunggi-do (KR); Sun Seok Han, Suwon-shi (KR); Choong Won Lee, Songnam-shi (KR); Sung Weon Lee, Yongin-shi (KR); Hong Sik Byun, Songnam-shi (KR)

(73) Assignee: Jusung Engineering Co. Ltd. (KR)

( * ) Notice: Subject to any disclaimer, the term of this patent is extended or adjusted under 35 U.S.C. 154(b) by 0 days.

(21) Appl. No.: 10/003,195

(22) Filed: Nov. 14, 2001

(65) Prior Publication Data

US 2002/0088548 A1 Jul. 11, 2002

(30) Foreign Application Priority Data

Nov. 15, 2000 (KR) .......................................... 2000-67701

(51) Int. Cl.$^7$ .............................. C23C 16/00; C23F 1/00

(52) U.S. Cl. ................................ 156/345.48; 118/723 I

(58) Field of Search ..................... 118/723 I, 723 IR, 118/723 AN; 156/345.48, 348.49; 204/298.06, 298.34; 315/111.51

(56) References Cited

U.S. PATENT DOCUMENTS

| 5,468,296 | A | | 11/1995 | Patrick et al. ............... 118/723 |
| 5,567,267 | A | * | 10/1996 | Kazama et al. .......... 156/345.27 |
| 5,951,773 | A | | 9/1999 | Jang et al. .................... 118/723 |
| 6,286,451 | B1 | * | 9/2001 | Ishikawa et al. ........... 118/723 I |
| 6,326,597 | B1 | * | 12/2001 | Lubomirsky et al. ........ 219/494 |
| 6,387,208 | B2 | * | 5/2002 | Satoyoshi et al. ...... 156/345.37 |

FOREIGN PATENT DOCUMENTS

JP 7-230954 * 8/1995

* cited by examiner

*Primary Examiner*—Luz Alejandro-Mulero
(74) *Attorney, Agent, or Firm*—Marger Johnson & McCollom, P.C.

(57) ABSTRACT

Disclosed is an apparatus for generating ICP, which has a heater having a hot wire as a heating source for heating elements in a chamber and inner wall of the chamber and also efficiently transfers heat of the heater through a heat transferring gas to the elements in the chamber and the inner wall of the chamber. According to the present invention, the elements in the chamber and the inner wall of the chamber can be heated up to a temperature of about 200° C., thereby reducing the adhesion of the by-product served as the source generating the undesirable particles. In addition, since the hot wire having a longer life span than the halogen lamp is used as heat radiating means, the life span of the apparatus is also increased.

11 Claims, 5 Drawing Sheets

APPARATUS FOR GENERATING INDUCTIVELY COUPLED PLASMA

BACKGROUND OF THE INVENTION

1. Field of the Invention

The present invention relates to an apparatus for generating ICP (inductively coupled plasma), and more particularly, to an apparatus for generating ICP, enabling to reduce occurrence of undesirable particles.

2. Description of the Related Art

Semiconductor processing equipments using plasma are generally classified into etching equipment and depositing equipment. When a semiconductor process is performed in the semiconductor processing equipment, by-products are inevitably adhered to elements and inner wall of a chamber. The adhered by-product acts as a source that generates undesirable particles during the semiconductor process, thereby degenerating the productivity.

In order to restrain the generation of the particles, the adhesion of the by-product has to be restrained. Further, in order to restrain the adhesion of the by-product, there is used a method of heating the elements or the inner wall of the chamber. As examples of such the heating method, there are a radiant heating method using a halogen lamp, a heat conduction method using a heater, and a heat convection method using hot air. These methods are selectively used depending on kinds or situations of process.

FIG. 1 is a schematic view of a conventional apparatus for generating ICP. Referring to FIG. 1, a chamber 10 provides a hermetical space for performing a plasma process. The hermetical space is divided into three spaces horizontally by an antenna plate 20 and a gas distribution plate 30. The gas distribution plate 30 is placed below the antenna plate 20.

A plurality of injecting holes are formed in the gas distribution plate 30. Between the antenna plate 20 and the gas distribution plate 30, there is disposed a reaction gas supplying port (not shown). A reaction gas introduced through the reaction gas supplying port to a space between the antenna plate 20 and the gas distribution plate 30 is injected through the injecting holes of the gas distribution plate 30 to a space below the gas distribution plate 30. At the lower space of the gas distribution plate 30, there is formed a reaction gas discharging port (not shown). The reaction gas injected to the lower space of the gas distribution plate 30 is converted into a plasma state by an electromagnetic field formed by an RF antenna 25 mounted on the antenna plate 20. Reflectance of RF power applied to the RF antenna 25 is minimized through a matching box 50.

Since the gas distribution plate 30, the inner wall of the chamber 10 and the antenna plate 20 are exposed to the plasma and the by-product such as polymer is deposited to surfaces of the inner wall and the antenna plate 20 during the process. The deposited by-product is served as a source that generates undesirable particles during the process. Therefore, in order to reduce the deposition of the by-product, a plurality of halogen lamps 45 for heating the elements of the chamber 10, such as the gas distribution plate 30, and the inner wall of the chamber 10 are disposed over the antenna plate 20. The halogen lamp 45 is fixed by a lamp supporting plate 40.

If the halogen lamp 45 is excessively apart from the antenna plate 20, an intensity of the light arrived at the antenna plate 20 is rapidly reduced. Therefore, there occurs a problem in that the gas distribution plate 30 is not sufficiently heated. This is because the intensity of light arrived at the antenna plate 20 is inversely proportional to a square of a distance between the antenna plate 20 and the halogen lamp 45. If the halogen lamp 45 is disposed to be adjacent to the antenna plate 20 in order to prevent the foregoing problem, an RF noise phenomenon occurs due to a high frequency generated from the RF antenna 25. Further, there is a problem that a distribution of heat arrived at the antenna plate 20 and the gas distribution plate 30 is not uniform.

Therefore, in order to equally heat the gas distribution plate 30 while the halogen lamp 45 is not influenced by the RF noise, the halogen lamp 45 has to be apart from the antenna plate 20 at a proper distance. However, in this case, the gas distribution plate 30 is heated only at a temperature of 70~80° C. Therefore, there is a problem that the gas distribution plate 30 is not sufficiently heated.

According to the conventional apparatus for generating ICP, in order to sufficiently heat the elements within the chamber 10, such as the gas distribution plate 30, and the inner wall of the chamber 10 without the generation of the RF noise phenomenon, the halogen lamp 45 has to be apart from the antenna plate 20 at a long distance and the number of halogen lamps 45 also has to be increased. However, in this case, there are some problems that an operation and an installation of the halogen lamp 45 are complicated and fabrication and operation costs are increased.

SUMMARY OF THE INVENTION

Therefore, it is an object of the present invention to provide an apparatus for generating ICP, which is capable of heating the elements in the chamber and inner wall of the chamber without generation of the RF noise.

To achieve an aforementioned object of the present invention, there is provided an apparatus for generating ICP, the apparatus comprising a chamber providing a hermetical space; an antenna plate disposed to horizontally divide the hermetical space; a gas distribution plate disposed to horizontally divide a space below the antenna plate and having a plurality of injecting holes; a reaction gas supplying port disposed at a space between the antenna plate and the gas distribution plate so as to inject a reaction gas through the injecting holes of the gas distribution plate to a space below the gas distribution plate; a reaction gas discharging port disposed to discharge the reaction gas injected to the lower space of the gas distribution plate; an RF antenna for forming plasma at the lower space of the gas distribution plate, which is mounted on the antenna plate; a heating plate for heating the chamber, which is disposed to horizontally divide a space above the antenna plate and which has a plurality of air holes; a heat transferring gas supplying port disposed at a space above the heating plate so as to inject a heat transferring gas through the air holes of the heating plate to a space between the heating plate and the antenna plate; and a heat transferring gas discharging port disposed to discharge the heat transferring gas injected to the space between the heating plate and the antenna plate.

Preferably, the heating plate is comprised of a two-layered aluminum plate having a recessed groove at a junction portion therebetween, a hot wire disposed in the recessed groove along the recessed groove, and an insulating member enclosing the hot wire. Alternatively, the heating plate is comprised of a two-layered aluminum plate, a plate type hot wire interposed between the two layers of the aluminum plate, and an insulating member enclosing the hot wire.

Meanwhile, it is preferable that the gas distribution plate is disposed according to an equation as follows;

$$10 \times \left(\frac{\varepsilon_{air}}{\varepsilon_p}\right) \times D < d < 100 \times \left(\frac{\varepsilon_{air}}{\varepsilon_p}\right) \times D,$$

where d is a distance between the heating plate and the antenna plate, $\varepsilon_p$ is an entire dielectric of the antenna plate and the gas distribution plate, $\varepsilon_{air}$ is a dielectric of air between the heating plate and the antenna plate, and D is an entire thickness of the antenna plate and the gas distribution plate.

Further, it is preferable that the air holes of the heating plate are disposed in two concentric circles respectively having radiuses $r_a$ and $r_b$ from a center of the heating plate, and a difference between the number of air holes disposed in the radius $r_a$ and the number of air holes disposed between the radiuses $r_b$-$r_a$ is in an extent of 20%.

Preferably, the air holes of the heating plate is disposed according to an equation as follows:

$$\left[\left(\frac{r_b}{r_a}\right)^2 - 1\right] \times 0.8 \leq \frac{N_{b-a}}{N_a} \leq \left[\left(\frac{r_b}{r_a}\right)^2 - 1\right] \times 1.2$$

where $N_a$ is the number of the air holes disposed in the radius $r_a$, and $N_{b-a}$ is the number of the air holes disposed in the radius $r_b$-$r_a$.

Further, it is preferable that the apparatus further comprises flow-meters disposed at each of the heat transferring gas supplying and discharging ports to be capable of controlling a flow rate of the transferring gas, and a feedback device comparing a temperature of the antenna plate with a desired reference temperature and outputting a controlling signal to the flow-meters so as to maintain the temperature of the antenna plate at the desired reference temperature.

Preferably, the apparatus further comprises a heat insulating plate and a water cooling line disposed at the inner wall of the chamber located at an upper portion of the antenna plate.

BRIEF DESCRIPTION OF THE DRAWINGS

The above objects and other advantages of the present invention will become more apparent by describing in detail preferred embodiments thereof with reference to the adhered drawings in which.

DETAILED DESCRIPTION OF THE PREFERRED EMBODIMENTS

Now, preferred embodiments of the present invention will be described in detail with reference to the annexed drawings.

Figure 1:
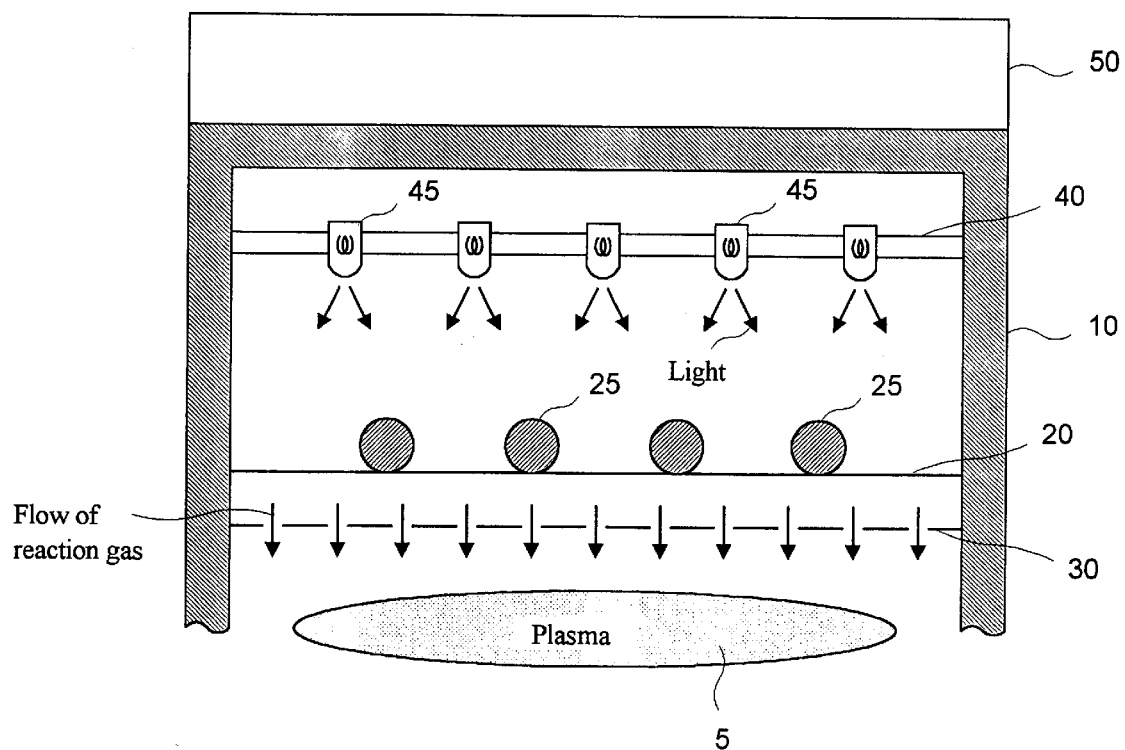
FIG. 1 is a schematic view of a conventional apparatus for generating ICP.
Figure 2:
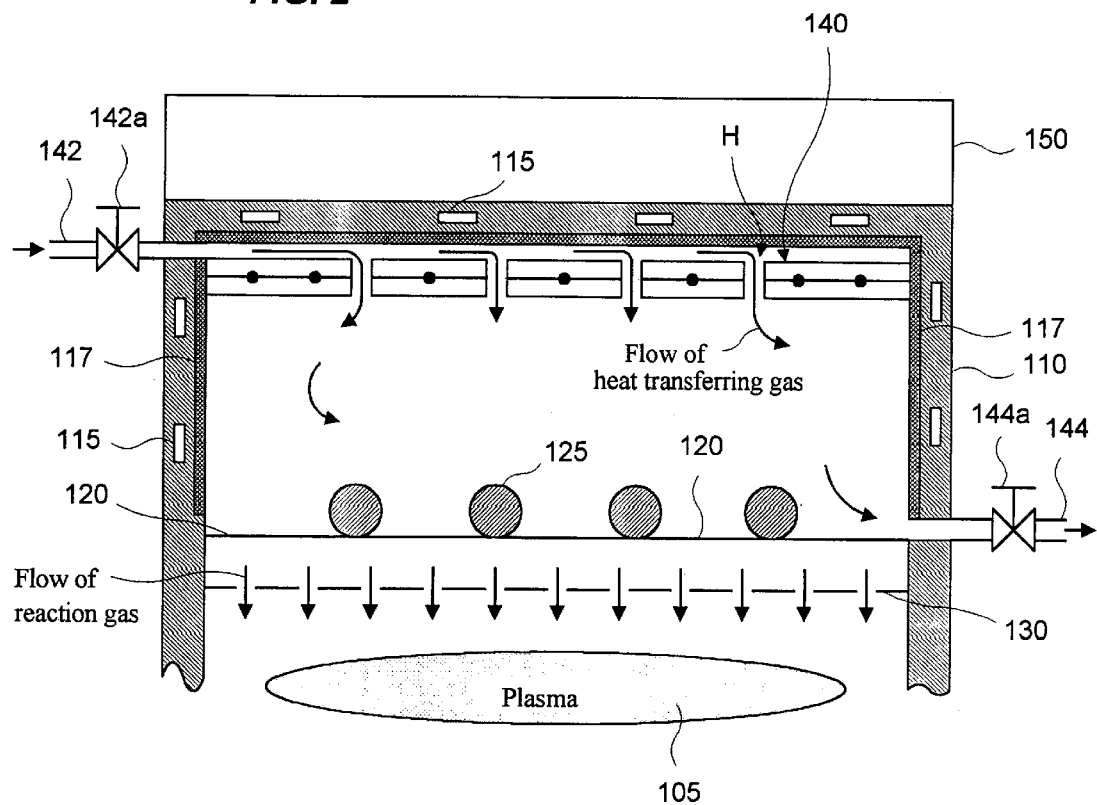
FIG. 2 is a schematic view of an apparatus for generating the ICP according to an embodiment of the present invention.

FIG. 2 is a schematic view of an apparatus for generating an ICP according to an embodiment of the present invention. Referring to FIG. 2, a chamber 110 is provided as a hermetical space for performing a plasma process. The hermetical space is divided into three spaces horizontally by an antenna plate 120 and a gas distribution plate 130. The gas distribution plate 130 is located below the antenna plate 120. The antenna plate 120 and the gas distribution plate 130 are made of ceramic.

A plurality of injecting holes are formed in the gas distribution plate 130. Between the antenna plate 120 and the gas distribution plate 30, there is disposed a reaction gas supplying portion (not shown). A reaction gas supplied through the reaction gas supplying port to a space between the antenna plate 120 and the gas distribution plate 130 is injected through the injecting holes of the gas distribution plate 130 to a space below the gas distribution plate 30.

At a space below the gas distribution plate 130, there is arranged a reaction gas discharging port (not shown). The reaction gas injected to a space below the gas distribution plate 130 is converted into a plasma state by electromagnetic field formed by a RF antenna 125 mounted on the antenna plate 120. Reflectance of RF power applied to the RF antenna 125 is minimized through a matching box 150 disposed at an outer upper portion of the chamber 110.

In order to reduce deposition of a by-product in the chamber 110, there is provided a heating plate 140 for heating elements of the chamber 110, such as the gas distribution plate 130, and inner wall of the chamber 110. The heating plate 140 is disposed to horizontally divide a space above the antenna plate 120, and it has a plurality of air holes H.

At a space above the heating plate 140, there is arranged a heat transferring gas supplying port 142. A heat transferring gas introduced through the heat transferring gas supplying port 142 into the upper space of the heating plate 142 is injected through the air holes H to a space between the heating plate 140 and the antenna plate 120. At the space between the heating plate 140 and the antenna plate 120, there is arranged a heat transferring gas discharging port 144 through which the heat transferring gas between the heating plate 140 and the antenna plate 120 is discharged.

Since heat generated from the heating plate 140 is transferred to the antenna plate 120 by the heat transferring gas, a temperature of the antenna plate 120 is influenced by pressure and flow rate of the heat transferring gas between the heating plate 140 and the antenna plate 120. Therefore, at the supplying port 142 and the discharging port of the heat transferring gas, there are respectively disposed flow-meters 142a and 144a which are capable of controlling the flow rate of the transferring gas. And also, at the space between the heating plate 140 and the antenna plate 120, there is disposed a feedback device (not shown) for controlling the pressure and the flow rate of the flowing heat transferring gas. The feedback device compares a temperature of the antenna plate 120 with a predetermined temperature so as to output a controlling signal to each of the flow-meter 142a, 144a, which is adapted to constantly maintain the temperature of the antennal plate 120 at a desired reference temperature.

Since a temperature around the heating plate 140 is increased to about 200° C., a heat insulating plate 117 and a water cooling line 115 are disposed at the inner wall of the chamber 110 located at an upper portion of the antenna plate 120 in consideration of safety of an operator and an erroneous operation of the matching box 150.

Figure 3A:
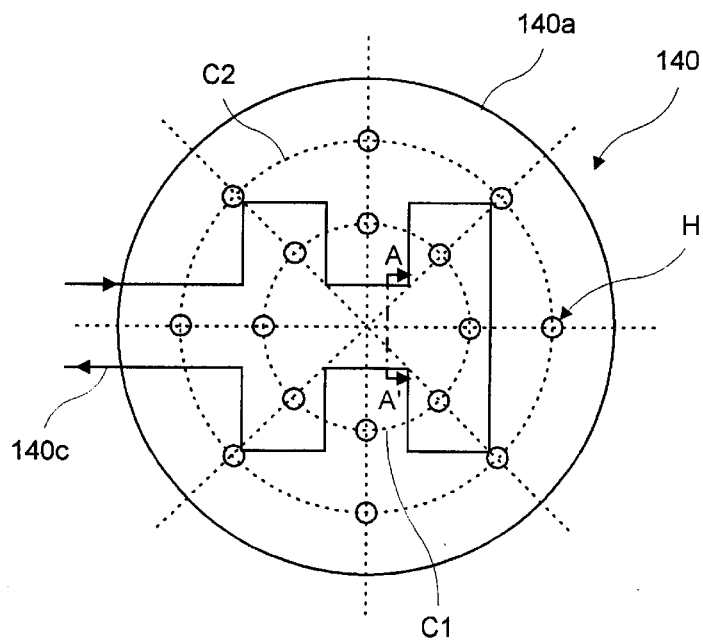
FIGS. 3a to 3e are views showing a heating plate of FIG. 2.
Figure 3B:
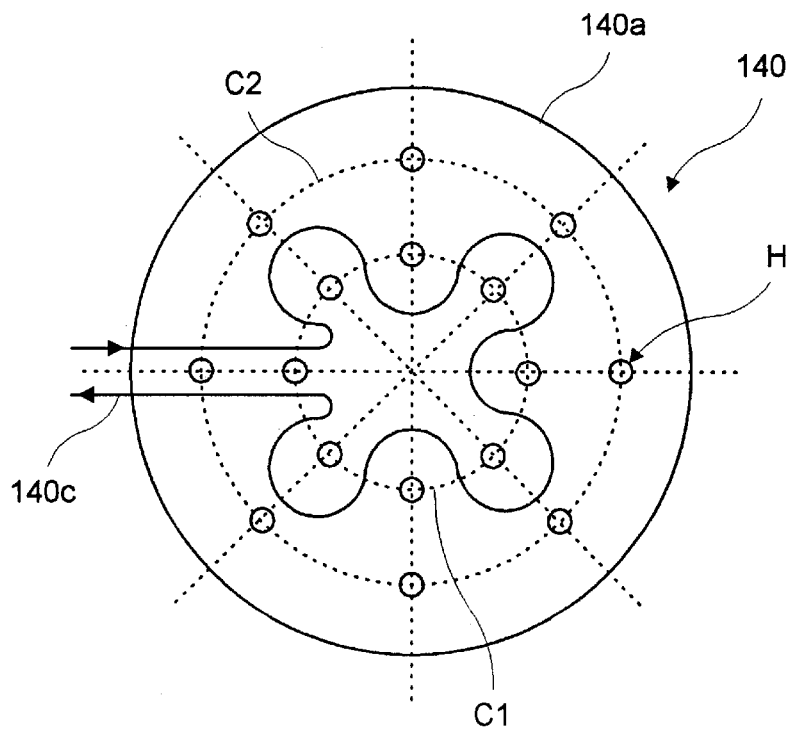
Figure 3C:
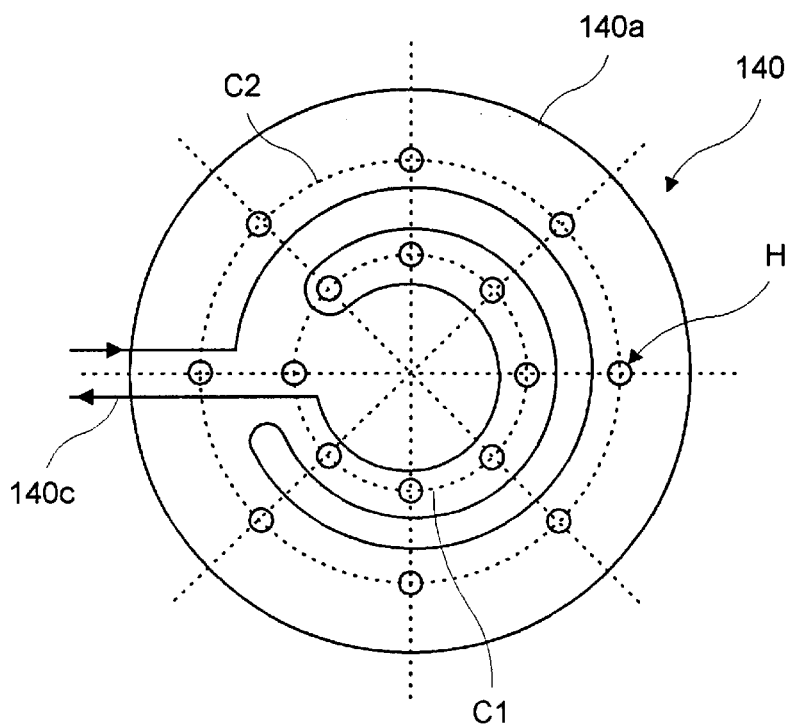
Figure 3D:
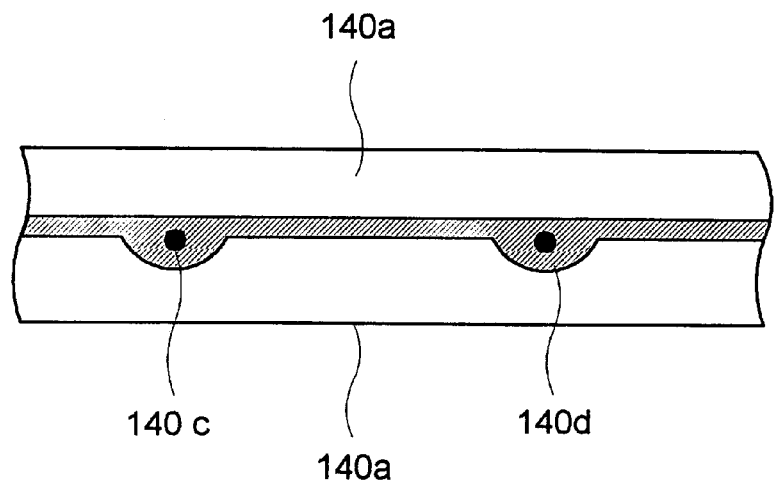
Figure 3E:
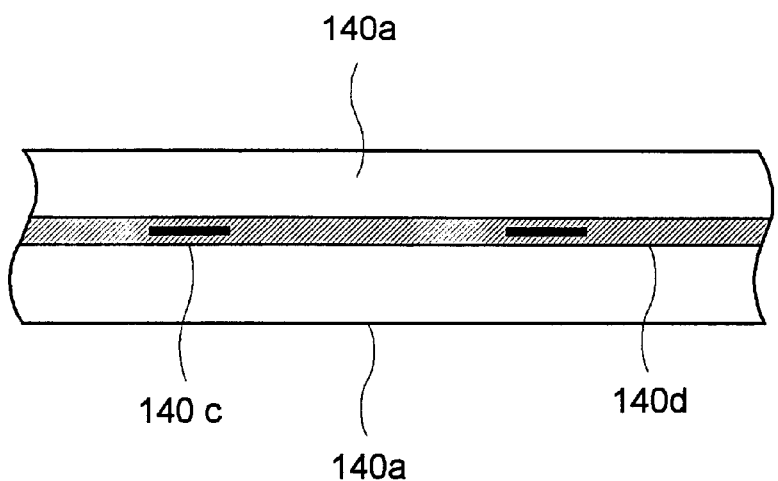

FIGS. 3a to 3e are views showing the heating plate 140. Herein, FIGS. 3a to 3c are plan views respectively showing three types of the heating plates, and FIGS. 3d and 3e are cross-sectional views showing two types of the heating plates taken along a line A–A' of FIG. 3a.

Referring to FIGS. 3a to 3d, the heating plate 140 is comprised of a two-layered aluminum plate 140a served as an RF shield and having high heat conductivity, a hot wire 140c as a heat radiating mean, and an insulating member 140d enclosing the hot wire 140c. The two-layered aluminum plate 140a has a recessed groove at a junction portion therebetween and is electrically grounded. The hot wire 140c is disposed around the air holes H along the recessed groove. Alternatively, a plate type hot wire 140c may be used, as shown in FIG. 3e. In this case, it is not necessary to provide the recessed groove at the aluminum plate 140a. As shown in FIGS. 3a to 3c, the hot wire 140c may be aligned in various types.

The air holes H are disposed in concentric circles C1 and C2 respectively having radiuses $r_a$ and $r_b$ ($r_a < r_b$). A difference between the number of air holes disposed in the circle C1 and the number of air holes disposed between the circles C1 and C2 is in an extent of 20%. When the air holes H are distributed in this way, as described above, the heat is equally transferred to the gas distribution plate 130.

For example, assuming that the number of the air holes H disposed in the radius $r_a$ is $N_a$, and the number of the air holes H disposed in the radius $r_b - r_a$ is $N_{b-a}$, it is preferable that the numbers $N_a$ and $N_{b-a}$ are defined according to an equation 1, as follows:

$$\left[\left(\frac{r_b}{r_a}\right)^2 - 1\right] \times 0.8 \leq \frac{N_{b-a}}{N_a} \leq \left[\left(\frac{r_b}{r_a}\right)^2 - 1\right] \times 1.2 \quad \text{[Equation 1]}$$

FIGS. 3a to 3c shows a result that the air holes H are aligned on circumferences of the circles C1 and C2, wherein the radius $r_a$ is 8, the radius $r_b$ is 12, the number $N_a$ is 8 and the number $N_{b-a}$ is 8. The air holes H are disposed on axes that equally divide the circles C1 and C2 into eight regions. Herein, the number $N_{b-a}$ is calculated by an equation 2, as follows:

$$N_{b-a} = \left[\left(\frac{r_b}{r_a}\right)^2 - 1\right] \times 0.8 \times N_a = 8 \quad \text{[Equation 2]}$$

Figure 4:
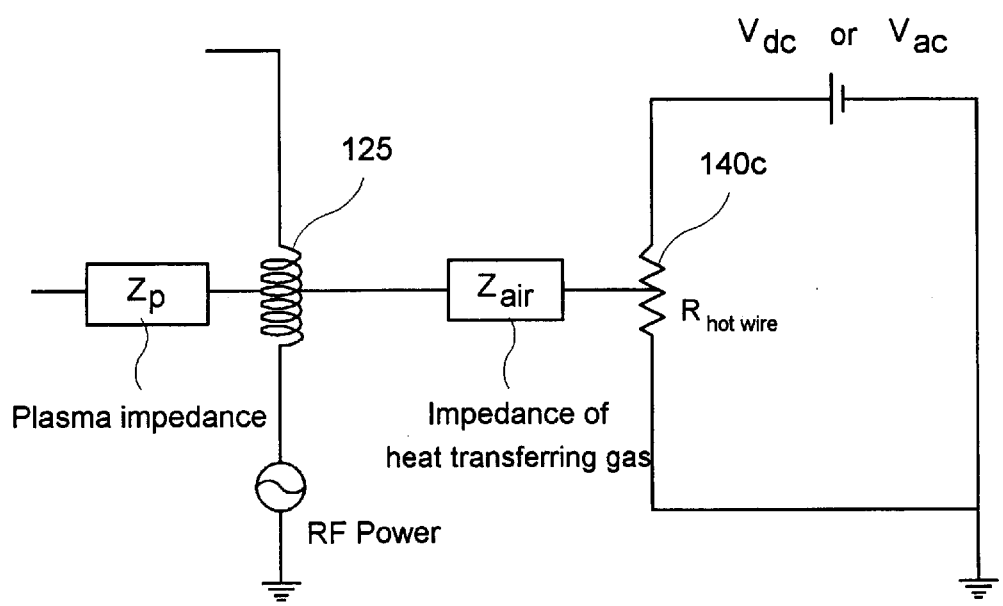
FIG. 4 is a circuit diagram showing an equivalent circuit between the heating plate and a gas distribution plate.

FIG. 4 shows an equivalent circuit between the heating plate 140 and the gas distribution plate 130. Referring to FIG. 4, assuming that a frequency of the RF power is $W_{RF}$, an entire dielectric of the antenna plate 120 and the gas distribution plate 130 is $\epsilon_p$, and an entire thickness of the antenna plate 120 and the gas distribution plate 130 is D, if a dielectric of the reaction gas between the antenna plate 120 and the gas distribution plate 130 is ignored, a plasma impedance $Z_p$ is calculated by an equation 3, as follows:

$$|Z_p| = \frac{1}{W_{RF} \times C_p}, \quad C_p = \frac{\epsilon_p \times A}{D} \quad \text{[Equation 3]}$$

Further, assuming that an dielectric of the heat transferring gas between the heating plate 140 and the antenna plate 120 is $\epsilon_{air}$, and a distance between the heating plate 140 and the antenna plate 120 is d, an impedance $Z_{air}$ of the heat transferring gas is calculated by an equation 4, as follows:

$$|Z_{air}| = \frac{1}{W_{RF} \times C_{air}}, \quad C_{air} = \frac{\epsilon_{air} \times A}{d} \quad \text{[Equation 4]}$$

Therefore, it may be shown as follows: $|Z_p/Z_{air}| = C_{air}/C_p = (\epsilon_{air}/\epsilon_p) \times (D/d)$. Since the less a value $Z_p/Z_{air}$ is smaller than 1, the more an efficiency of the RF power used for generating the plasma is increased, preferably, it is shown as follows: $d >> (\epsilon_{air}/\epsilon_p) * D$ in order to efficiently generate the plasma. However, since the distance d cannot be indefinitely increased, it is preferably that the distance d is calculated by an equation 5, as follows:

$$10 \times \left(\frac{\epsilon_{air}}{\epsilon_p}\right) \times D < d < 100 \times \left(\frac{\epsilon_{air}}{\epsilon_p}\right) \times D, \quad \text{[Equation 5]}$$

where it may be shown as follows: D<d<10*D, since the $\epsilon_p$ is about 10 and the $\epsilon_{air}$ is about 1.

According to the apparatus for generating the ICP, as described above, the elements in the chamber 110, such as the gas distribution plate 130, and the inner wall of the chamber 110 can be heated up to a temperature of about 200° C., thereby reducing the adhesion of the by-product served as the source generating the undesirable particles. In addition, since the hot wire 140c having a longer life span than the halogen lamp 45 is used as heat radiating means, the life span of the apparatus is also increased. And since the hot wire 140c is less influenced by the RF noise than the halogen lamp 45 and the aluminum plate 140a also functions as the RF shield, the influence by the RF noise is remarkably reduced.

While the present invention has been described in detail, it should be understood that various changes, substitutions and alterations can be made hereto without departing from the spirit and scope of the invention as defined by the appended claims.

What is claimed is:

1. An apparatus for generating ICP, comprising:

a chamber providing a hermetical space;

an antenna plate disposed to horizontally divide the hermetical space;

a gas distribution plate disposed to horizontally divide a space below the antenna plate and having a plurality of injecting holes;

a reaction gas supplying port disposed at a space between the antenna plate and the gas distribution plate so as to inject a reaction gas through the injecting holes of the gas distribution plate to a space below the gas distribution plate;

a reaction gas discharging port disposed to discharge the reaction gas injected to the space below the gas distribution plate;

an RF antenna for forming plasma at the space below the gas distribution plate, which is mounted on the antenna plate;

a heating plate for heating the chamber, which is disposed to horizontally divide a space above the antenna plate, the heating plate having a plurality of air holes extending therethrough;

a heat transferring gas supplying port disposed at a space above the heating plate so as to inject a heat transferring gas through the air holes of the heating plate to a space between the heating plate and the antenna plate; and a heat transferring gas discharging port disposed to discharge the heat transferring gas injected to the space between the heating plate and the antenna plate, wherein the plurality of air holes are structured to permit the heat transferring gas to pass therethrough.

2. The apparatus of claim 1, wherein the gas distribution plate is disposed according to an equation as follows;

$$10 \times \left(\frac{\varepsilon_{air}}{\varepsilon_p}\right) \times D < d < 100 \times \left(\frac{\varepsilon_{air}}{\varepsilon_p}\right) \times D,$$

wherein d is a distance between the heating plate and the antenna plate, $\epsilon_p$ is an entire dielectric of the antenna plate and the gas distribution plate, $\epsilon_{air}$ is a dielectric of air between the heating plate and the antenna plate, and D is an entire thickness of the antenna plate and the gas distribution plate.

3. The apparatus of claim 1, wherein the air holes of the heating plate are disposed in two concentric circles respectively having radiuses $r_a$ and $r_b$ from a center of the heating plate, and a difference between the number of air holes disposed in the radius $r_a$ and the number of air holes disposed between the radiuses $r_b$-$r_a$ is in an extent of 20%.

4. The apparatus of claim 3, wherein the air holes of the heating holes are aligned to be apart from each other at regular intervals.

5. The apparatus of claim 3, wherein the air holes of the heating plate is disposed according to an equation as follows:

$$\left[\left(\frac{r_b}{r_a}\right)^2 - 1\right] \times 0.8 \leq \frac{N_{b-a}}{N_a} \leq \left[\left(\frac{r_b}{r_a}\right)^2 - 1\right] \times 1.2$$

where $N_a$ is the number of the air holes disposed in the radius $r_a$, and $N_{b-a}$ is the number of the air holes disposed in the radius $r_b$-$r_a$.

6. The apparatus of claim 1, further comprising flowmeters disposed at each of the heat transferring gas supplying and discharging ports to be capable of controlling a flow rate of the transferring gas, and a feedback device comparing a temperature of the antenna plate with a desired reference temperature and outputting a controlling signal to the flowmeters so as to maintain the temperature of the antenna plate at the desired reference temperature.

7. The apparatus of claim 1, wherein the heating plate is comprised of a two-layered aluminum plate having a recessed groove at a junction portion therebetween, a hot wire disposed in the recessed groove along the recessed groove, and an insulating member enclosing the hot wire.

8. The apparatus of claim 1, wherein the heating plate is comprised of a two-layered aluminum plate, a plate hot wire interposed between the two layers of the aluminum plate, and an insulating member enclosing the hot wire.

9. The apparatus of claim 1, further comprising a heat insulating plate and a water cooling line disposed at the inner wall of the chamber located at an upper portion of the antenna plate.

10. The apparatus of claim 1, wherein the plurality of air holes are arranged radially to equally transfer heat to the gas distribution plate.

11. The apparatus of claim 1, wherein the heat transferring gas flow through the plurality of air holes.

* * * * *